United States Patent [19]
Nelson

[11] Patent Number: 4,712,223
[45] Date of Patent: Dec. 8, 1987

[54] LINEAR ALL-DIGITAL PHASE LOCKED LOOP

[75] Inventor: Blaine J. Nelson, Plano, Tex.

[73] Assignee: Rockwell International Corporation, El Segundo, Calif.

[21] Appl. No.: 917,335

[22] Filed: Oct. 9, 1986

[51] Int. Cl.[4] .......................... H03L 7/18; H04L 7/02
[52] U.S. Cl. ...................................... 377/43; 377/47; 328/63; 331/1 A
[58] Field of Search .................. 328/155, 133, 63, 72; 377/47, 48, 43; 331/1 A

[56] References Cited

U.S. PATENT DOCUMENTS 4,577,163 3/1986 Culp ................................. 328/155 X
4,627,080 12/1986 Debus, Jr. ....................... 328/162 X Primary Examiner—John S. Heyman
Attorney, Agent, or Firm—Bruce C. Lutz; V. L. Sewell; H. Fredrick Hamann

[57] ABSTRACT

A digital phase locked loop to function as a stable reference clock given a gapped, or pulse stuffed, input clock signal which may have a frequency offset relative to the nominal specified frequency and a phase jitter relative to the average frequency of the input signal, the digital phase locked loop comprising an input synchronizer for synchronizing the input clock signal to a stable high frequency reference clock. The output of the input synchronizer increments a write counter and resets a phase counter to zero at the begininning of each cycle of the input clock signal. The outputs of the write counter and the phase counter are sampled by a sampling circuit which interprets the sampled data in two's complement form. A digital filter receives the output of the sampling circuit and performs a low pass filter function on the sampled data and calculates a linearized approximation of the frequency to be generated by the offset (non-symmetric) digitally controlled oscillator (ODCO) which receives the output of the digital filter. The ODCO uses its input to determine the frequency of discrete phase adjustments placed in its output signal. The output of the ODCO is divided by a read counter. Each time the read counter enters a predetermined state, the sampling circuit is caused to sample the input clock signal and the process is repeated again and again.

9 Claims, 7 Drawing Figures

LINEAR ALL-DIGITAL PHASE LOCKED LOOP

BACKGROUND OF THE INVENTION

1. Field of the Invention

The present invention relates in general to phase locked loop circuitry. More particularly, the present invention relates to a linear all-digital phase locked loop for use in a digital communications network to provide a stable reference clock for a digital stream of pulses.

2. Description of the Prior Art

Various configurations of circuitry have previously been used to accomplish the phase locked loop function. The first and most common configuration is the analog phase locked loop (PLL) and comprises a digital phase comparator to receive the input signal and is followed by a pulse width demodulator to accomplish phase detection. The output signal from the pulse width demodulator is filtered, amplified and fed into a voltage controlled oscillator (VCO). The input signal to the VCO is a time varying voltage and is converted by the VCO to a proportional frequency. The output of the VCO is fed back to the phase comparator as a reference signal. A typical VCO in this circuit includes a varactor. By changing the reverse-bias voltage across the varactor, the impedance of the feedback network is changed and thus the resonant frequency of the oscillator is changed. The use of the varactor introduces a slight non-linearity to the transfer function of the VCO.

A second configuration is a random-walk digital phase locked loop (PLL) and comprises a sampler circuit which receives the input signal and is followed by an up/down counter. The output of the up/down counter provides an input to a divider which generates the PLL output. The PLL output is also feedback to the sampler circuit and the up/down counter as a reference signal. The sampler circuit determines whether the input signal is leading or lagging the reference signal and provides one output to the up/down counter if the input signal is leading and a second output to the up/down counter if the input signal is lagging. Depending upon the value output by the sampler, the up/down counter is incremented or decremented. When the up/down counter reaches its maximum value ($2^{m-1}$), a divide by $n+1$ or $n-1$ occurs and the up/down counter is reset to its initial value. It has been shown that this configuration is suitable for simple frequency tracking (DC operation) but its AC characteristics, such as intrinsic (or internally generated) jitter and jitter gain, make it unsuitable for the function to be performed by the present invention.

SUMMARY OF THE INVENTION

The present invention is an all digital linear phase locked loop functioning as a stable reference clock given a gapped, or pulse stuffed, input clock signal which may have a carrier frequency offset relative to the nominal specified carrier frequency and phase jitter relative to the average frequency of the input signal. The present invention is particularly useful as a reference for the low speed outputs of a digital multiplexer/demultiplexer and comprises an input synchronizer for synchronizing the input demultiplex clock signal to a stable high frequency reference clock $f_{HS}$. The output of the input synchronizer increments a write counter, which is always used in such a multiplexer/demultiplexer system, and resets a phase counter (introduced as a consequence of the present invention) to zero at the beginning of each cycle of the input clock signal. The outputs of the write counter and the phase counter provide an integer and fractional part of the phase difference ($\phi_{in} - \phi_{ref}$) respectively. These outputs are sampled by a sampling circuit which interprets the sampled data in two's complement form. A digital filter receives the output of the sampling circuit and performs a low pass filter function on the sampled data and calculates a linearized approximation of the frequency to be generated by the offset (non-symmetric) digitally controlled oscillator (ODCO) which receives the output of the digital filter. The ODCO uses its input to determine the frequency of discrete phase adjustments placed in its output signal. The output of the ODCO is divided by a read counter whose sequence length is determined by the particular application. Each time the read counter enters a predetermined state, the sampling circuit samples the relative phase of the input clock signal and the process is repeated iteratively.

Among the advantages offered by the present invention is the immunity to a gapped input signal which carries intrinsic jitter. The present invention has added reliability and repeatability over its analog counterpart. The present invention provides the capability of extracting the phase of a digital input signal from the leading edge of a cycle to any point within a given cycle. The present invention allows the phase difference between the digital input signal and the digital output signal to be extracted as a number. The present invention provides a linear system not achievable in other digital systems presently available.

Examples of the more important features and advantages of the present invention have thus been summarized rather broadly in order that the detailed description thereof that follows may be better understood and in order that the contribution to the art may be better appreciated. Other features of the present invention will become apparent with reference to the following detailed description of a presently preferred embodiment thereof in connection with the accompanying drawing in which:

DESCRIPTION OF THE PREFERRED EMBODIMENT

Figure 1:
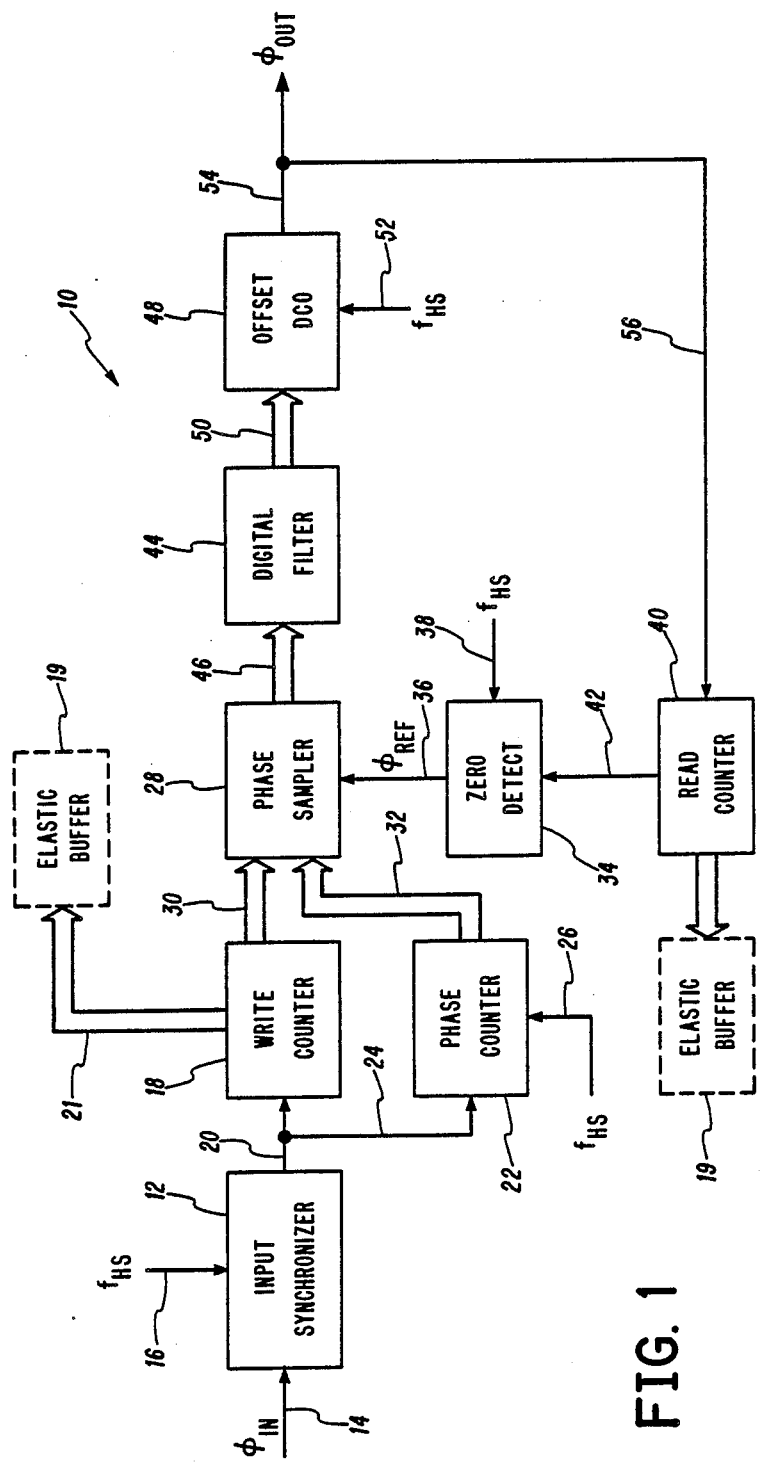
FIG. 1 is a simplified block diagram of a digital phase locked loop according to the present invention.

Referring now to the drawing wherein like reference numerals designate like or corresponding elements throughout the several views, the linear all-digital phase locked loop is referred to generally by reference numeral 10. With reference to FIG. 1, the digital phase locked loop 10 comprises input synchronizer 12 which receives a first input on lead 14 and a second input on lead 16. The first input comprises a clock signal $\phi_{in}$ consisting of a digital stream of pulses at an average of 1.544 megahertz (MHz) which may have a carrier frequency offset and phase jitter. The second input comprises a high speed reference clock or reference frequency $f_{HS}$ which is just less than thirty-two times higher in frequency than the first input. The clock signal $\phi_{in}$ is derived from the digital stream of information received in the demultiplex path of the digital multiplexer/demultiplexer system. The output of the input synchronizer 12 is delivered to a write counter 18 on lead 20 where said output increments the write counter 18 and the output is also delivered to a phase counter 22 on lead 24 where said output resets the phase counter 22 to zero. An additional input to the phase counter 22 is high speed reference clock or reference frequency $f_{HS}$ which is input on lead 26 and acts as a clock to the phase counter 22.

The output of write counter 18 (in the form of a number) is directed to phase sampler 28 on lead 30 while the output of phase counter 22 (also in the form of a number) is directed to phase sampler 28 on lead 32. An output of write counter 18 is also directed to an elastic buffer 19 on lead 21. The elastic buffer 19 is not part of the phase locked loop 10 but is involved in other functions in the digital multiplex/demultiplex system. The output $\phi_{ref}$ of zero detect 34 is input to phase sampler 28 on lead 36 and initiates a sampling function by phase sampler 28. Zero detect 34 receives the high speed reference clock or reference frequency $f_{HS}$ signal on lead 38 and the output of read counter 40 on lead 42. The read counter 40 also provides an output to elastic buffer 19. The output of phase sampler 28 (in the form of a two's complement number) is provided as an input to digital filter 44 on lead 46. Digital filter 44 is a low-pass filter which processes the received number and provides an output (in the form of a number) to the offset digitally controlled oscillator (ODCO) 48 on lead 50. The ODCO 48 also receives the high speed reference clock or reference frequency $f_{HS}$ as an input on lead 52. The average output frequency signal $\phi_{out}$ of the ODCO 48 is available on lead 54 and is also fed back as an input signal on lead 56 to the read counter 40.

Figure 2A:
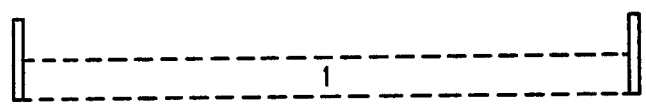
FIGS. 2a and 2b are simplified diagrams of the outputs of a write counter and a phase counter used to determine the sampled phase differences ($\phi_{in} - \phi_{ref}$) in the digital phase locked loop of FIG. 1.
Figure 2B:
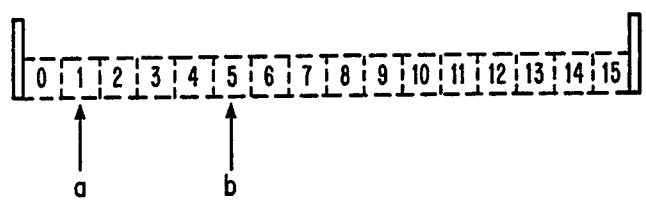

In operation, the received clock signal $\phi_{in}$ at 1.544 MHz on lead 14 is synchronized to the high speed reference clock or reference frequency $f_{HS}$ by the input synchronizer 12. The synchronized clock signal from the input synchronizer 12 is input to the write counter 18 and the phase counter 22. Each time that the leading edge of a pulse of the synchronized clock signal (the beginning of each input cycle) enters the write counter 18, the write counter 18 is incremented one count (to the next state) until some predetermined count is reached (depending upon the particular design) and then the write counter 18 is recycled to zero and the cycle repeats, etc. Each time that the leading edge of a pulse of the synchronized clock signal (the beginning of each input cycle) enters the phase counter 22, phase counter 22 resets to zero. Phase counter 22 is running at a much higher rate than the write counter 18 and is clocked by the high speed reference clock or reference frequency $f_{HS}$. In the present embodiment, phase counter 22 is designed to change sixteen times or count to sixteen while write counter 18 changes once or one count occurs (the period between reset pulses). This relationship is shown in FIGS. 2a and 2b with FIG. 2a depicting a normal period of the write counter 18, which in this example is designated as the integer one (1). FIG. 2b depicts the same period of the phase counter 22, which in the present invention comprises sixteen counts or cycles.

With reference to FIGS. 2a and 2b, phase sampler 28 samples the two signals and combines them to provide an indication of the value of the phase from the leading edge of the pulse to any point within a given cycle at the time the sampling occurs. The manner in which the signals are combined is that the number in the write counter 18 (FIG. 2a) is followed by a decimal point which is followed by the number in the phase counter (FIG. 2b) at the time of sampling. If the sampling occurs at the time of the arrow labeled a, then the number would be 1 1/16. If the sampling occurs at the time shown by arrow labeled b, then the number would be 1 5/16. The incoming signal has been converted from a continuous clock signal into a representation of the phase from the leading edge of the cycle to any point within a given cycle. For the above examples, the phase of the input signal relative to the output signal is 1 1/16 bits and 1 5/16 bits, respectively. Therefore the frequency of the output can be increased or decreased to bring the phase difference between the input and the output to zero.

The output signals (in the form of numbers in a predetermined format) from the write counter 18 and the phase counter 22 are being continuously fed to phase sampler 28 which then samples these received signals upon receipt of the $\phi_{ref}$ signal from zero detect 34. The phase sampler 28 combines the numbers of the incoming signals from the counters 18 and 22 and interprets the sampled numbers or data in a two's complement form or format. The interpreted number is delivered to the digital filter 44 which then performs a low pass function and a gain function on the interpreted number thereby controlling the closed loop response and providing the necessary stabilization. The digital filter 44 calculates a linearized approximation of the frequency to be generated by the ODCO. The ODCO receives the filtered version of the interpreted number and generates a digital output signal $\phi_{out}$ having an average output frequency based upon that filtered version of the interpreted number.

The digital output signal $\phi_{out}$ is delivered back to read counter 40. Each time the read counter enters a predetermined state, a signal $\phi_{ref}$ is sent to the phase sampler 28 which then again samples the numbers of the incoming signals from the counters 18 and 22. A new number is then delivered to the ODCO which generates a digital output signal $\phi_{out}$ having an average output frequency based upon the received number and the process is repeated iteratively.

Figure 3:
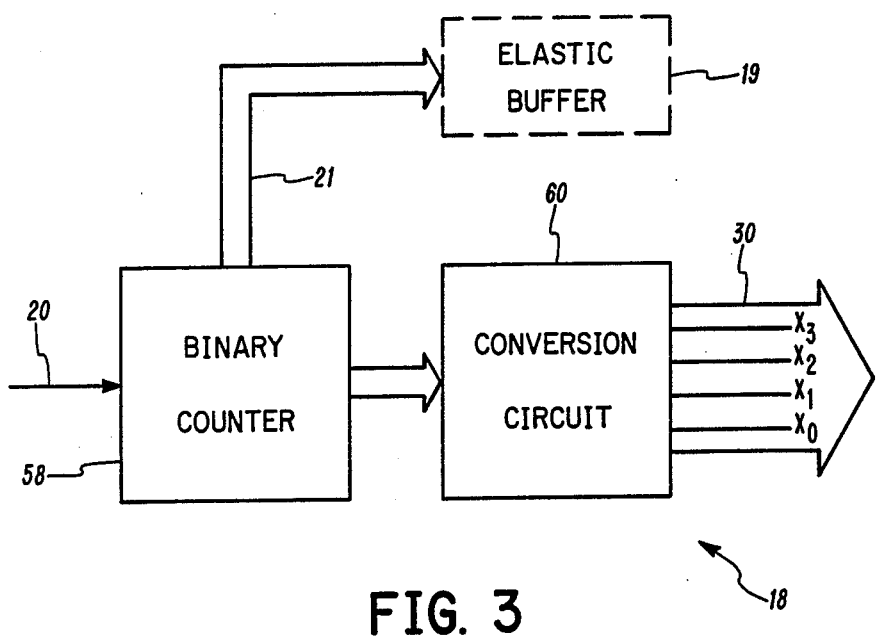
FIG. 3 is a simplified block diagram of a write counter used in the digital phase locked loop of FIG. 1.

With reference to FIG. 3, write counter 18 comprises binary counter 58 and conversion circuit 60. Binary counter 58 counts up to a predetermined number and then rolls back to zero and repeats the cycle. In the disclosed embodiment, binary counter 58 counts from 0-10 and its output on lead 30 is noted as $X_3$-$X_0$. Every time that the leading edge of a pulse is input on lead 20 to binary counter 58, binary counter 58 increments to the next state and the count at that point in time is input to the conversion circuit 60 which converts the digital count to a two's complement code or notation which is input to the phase sampler 28. In addition, binary counter 58 performs a dual function by also providing a count as an output to elastic buffer 19 which addresses serial data storage locations in the elastic buffer 19.

Figure 4:
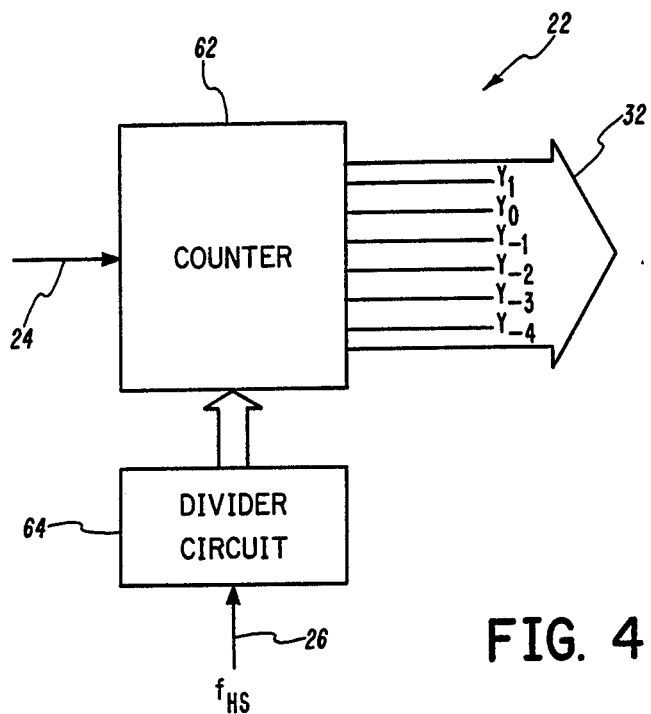
FIG. 4 is a simplified block diagram of a phase counter used in the digital phase locked loop of FIG. 1.

With reference to FIG. 4, phase counter 22 comprises counter 62 and a divider circuit 64. In the preferred embodiment, counter 62 comprises a six bit counter capable of counting from zero to thirty-one. The high speed reference clock or reference frequency $f_{HS}$ is input to the divider circuit 64 which, as the name implies, divides $f_{HS}$ to provide a clock signal to counter 62 that is the correct rate such that counter 62 will count sixteen cycles, in its free-running state, between the receipt of consecutive synchronized clock signals from input synchronizer 12. As was previously noted, the receipt of a synchronized clock signal from input synchronizer 12 resets counter 62 to zero. The output signals labeled $Y_1$ thru $Y_{-4}$ are delivered to phase sampler 28. $Y_1$ and $Y_0$ are considered the integer portion of the phase offset while $Y_{-1}$ to $Y_{-4}$ is the fractional part of the phase offset.

Figure 5:
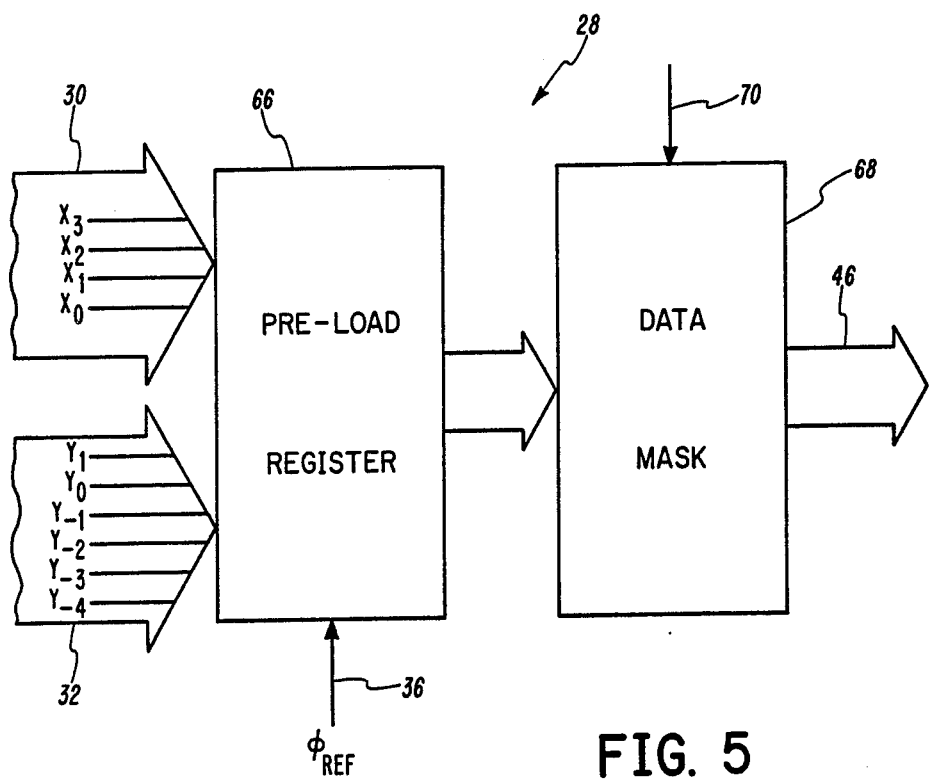
FIG. 5 is a simplified block diagram of a phase sampler used in the digital phase locked loop of FIG. 1 which provides a phase frequency characteristic to the phase sampler.

With reference to FIG. 5, phase sampler 28 comprises preload register 66 and data mask 68. The sampler function is to convert the sampled data into two's complement form for numerical processing in digital filter 44. Preload register 66 receives the $X_3$-$X_0$ number signals from the write counter 18 and the $Y_1$-$Y_{-4}$ number signals from the phase counter 22. Each time preload register 66 receives the $\phi_{ref}$ signal the incoming number signals are sampled and added together to obtain a nine bit number which is input to data mask 68 and on to digital filter 44. As necessitated by the two's complement usage, the number signal from write counter 18 is sign extended by taking the $X_3$ bit and shifting it as a mirror image to the $X_4$ bit position or sign bit position. The value of Y is always positive. The addition and resulting number is as follows:

$$X_4X_3X_2X_1X_0 \cdot$$
$$Y_1Y_0 \cdot Y_{-1}Y_{-2}Y_{-3}Y_{-4}$$
$$\overline{X_4Z_3Z_2Z_1Z_0 \cdot Z_{-1}Z_{-2}Z_{-3}Z_{-4}}$$

If the digital phase locked loop 10 cannot track the incoming signal $\phi_{in}$, an out-of-lock detector (not shown) provides a signal on lead 70 which causes data mask 68 to insert a specific code, the maximum tolerable phase offset, into digital filter 44 via lead 46. The specific code biases the ODCO to a specific frequency which aids acquisition and lock-in time of the loop. Digital filter 44 is a standard recursive approximation to an analog first order low pass filter obtained through a bilinear transform. Digital filter 44 includes the provision for biasing the output value of the filter by the number ninety-four.

Figure 6:
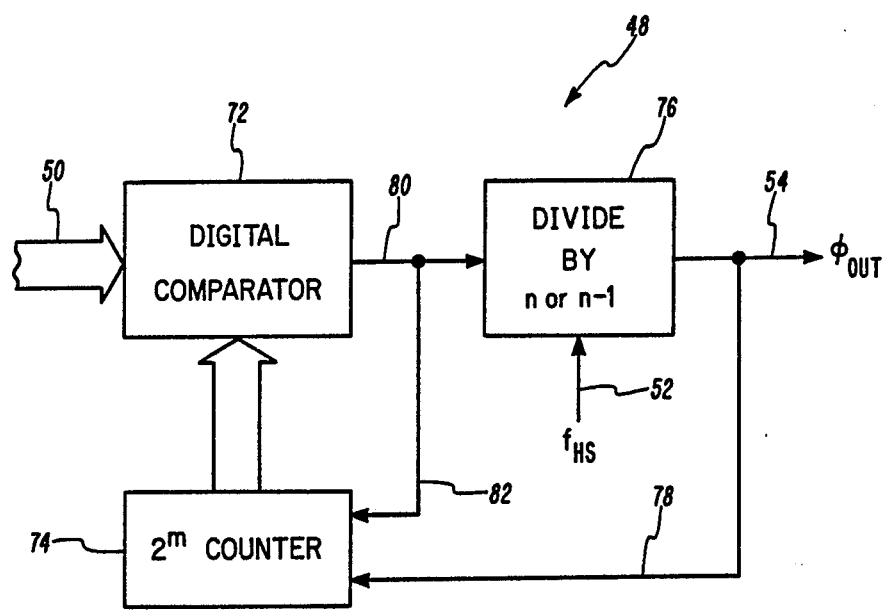
FIG. 6 is a simplified block diagram of an offset digitally controlled oscillator used in the digital phase locked loop of FIG. 1.

With reference to FIG. 6, ODCO comprises digital comparator 72, $2^m$ counter 74 and divide by n or n−1 divider 76. In the disclosed embodiment n is thirty two and m is eight. High speed reference clock $f_{HS}$ is input to divider 76 on lead 52 and $f_{HS}$ is divided by thirty-two so that for every thirty second cycle of $f_{HS}$ a pulse is output as signal $\phi_{out}$ on lead 54. The pulse is also input to $2^m$ counter 74 on lead 78 and increments the $2^m$ counter 74. The count of $2^m$ counter 74 is output to digital comparator 72 where it is compared to the input number received on lead 50 from digital filter 44. As long as the count from the $2^m$ counter 74 is less than the input number on lead 50, the compare signal on lead 80 is not active and is a logic 0 and the high speed reference clock $f_{HS}$ is divided by thirty-two. So when the compare signal on lead 80 is not active, the high speed reference clock $f_{HS}$ is just divided by thirty-two and that becomes the low speed clock signal $\phi_{out}$.

When the $2^m$ counter 74 has been incremented such that its output is equal to or greater than the input number on lead 50, the compare signal or lead 80 becomes active which then causes the high speed reference clock $f_{HS}$ to be divided by thirty-one for that cycle. So for one cycle the low speed clock signal $\phi_{out}$ has a shorter cycle. The compare signal on lead 80 is input to $2^m$ counter 74 and resets the $2^m$ counter 74 to zero and a new sequence starts over again with the result being dependent upon the value of the input number on lead 50.

In prior versions of digitally controlled oscillator (DCO), a symmetrical scheme of generating an output frequency is employed. In this scheme the center output frequency $f_0$ is generated by simply dividing the high speed reference frequency $f_{HS}$ by the number n, therefore, the center frequency is $f_0 = f_{HS}/n$. Frequencies above or below $f_0$ are generated by dividing $f_{HS}$ by n for m output cycles and then dividing $f_{HS}$ by n−c or n+c. This sequence of m+1 cycles is repeated giving an average output frequency of:

$$f = f_{HS}\left[\frac{m+1}{m \cdot n + [n \pm 1]}\right] = f_{HS} \cdot K[m]. \tag{1}$$

K[m] in equation (1) is approximately equal to 1/m. In order to linearize the function the prior art used ROM or other programmable devices to predistort the input to the DCO and thus linearize the transfer function of the DCO. This scheme when implemented is costly and complicated.

The operating point of the DCO, in prior art versions, required that m→∞ for f to equal $f_0$. That is, a divide by n−c or n+c never occurs. But as the value of m increases so does the sampling period. Therefore, as m→∞   DCO Bandwidth→0.

The value of m at the operating point also leads to the following:

$$\frac{\delta f(m)}{\delta m} = \frac{\delta}{\delta m}\left[\frac{f_{HS}(n \pm c - 1)}{(mn + n + c)^2}\right] \approx \frac{f_{HS}}{m^2}\ [n << m] \tag{2}$$

so as $m \to \infty$   $\frac{\delta f(m)}{\delta m} \to 0.$

Therefore the small signal response of the symmetrical DCO is zero at the operating point.

In order for the ODCO of the present invention to meet system specifications the problems of the prior art must be eliminated. From the discussion of the symmetrical DCO it is obvious that the operating value of m must be reduced to a noninfinite value.

In doing so the equation (1) is changed to $$f = f_{HS}\left(\frac{M_0 + m + 1}{(M_0 + m)n + [n - c]}\right) \tag{3}$$

so the equation $f_0 = f_{HS}/n$ no longer applies and is replaced by $$f_0 = \left[ \frac{M_0 + 1}{M_0 n + n - c} \right] f_{HS} \quad (4)$$

$M_0$ is the operating value of m. The term offset arises from equation (3) because $f_0$ is not related to $f_{HS}$ by an integer value. The value of n−c in the equation can also be n+c although there is a corresponding increase in $f_{HS}$.

The small signal response of the ODCO is defined by equation (2) and is $$\frac{\delta f(m)}{\delta m} \approx \frac{f_{HS}}{M_0^2} \quad (5)$$

which for $M_0 \neq \infty$ is non-zero thus eliminating the response problems of the DCO.

The Bandwidth of the ODCO is given by $$BW = \tfrac{1}{2} \left[ \frac{f_{HS}}{M_0 n + n - 1} \right] \quad (6)$$

which is non-zero for $m \neq \infty$.

The previous discussion presents a nonrigorous explanation of the prior art and the present invention and illustrates the improvement in performance of the ODCO over the prior art.

From the foregoing it will be seen that this invention is one well adapted to obtain all of the ends and objects hereinabove set forth, together with other advantages which are obvious and which are inherent to the apparatus. It will be understood that certain features and subcombinations are of utility and may be employed without reference to other features and subcombinations. This is contemplated by and is within the scope of the claims.

NONPRINTED APPENDICES APPEARING IN SUBJECT PATENT FILE

Appendix A is a simplified schematic diagram of the phase counter.

Appendix B is a simplified schematic diagram of the divider portion of the phase counter.

Appendix C is a simplified schematic diagram of the lower phase counter portion of the phase counter.

Appendix D is a simplified schematic diagram of the upper phase counter portion of the phase counter.

Appendix E is a simplified schematic diagram of the write counter.

Appendix F is a simplified schematic diagram of the phase sampler and a portion of the digital filter.

Appendix G is a simplified schematic diagram of the input synchronizer.

Appendix H is a simplified schematic diagram of the digital comparator.

Appendix I is a simplified schematic diagram of the divide by n or n−1 divider.

Appendix J is a simplified schematic diagram of the $2^m$ counter.

Appendix K is a simplified schematic diagram of the lower portion of the $2^m$ counter.

Appendix L is a simplified schematic diagram of the upper portion of the $2^m$ counter.

As many possible embodiments may be made of the invention without departing from the scope thereof, it is to be understood that all matter herein set forth or shown in the accompanying drawing is to be interpreted by illustrative and not in a limiting sense.

What is claimed is:

1. A linear all-digital phase locked loop for providing an output signal comprising a stable reference clock signal from a gapped input clock signal, said digital phase locked loop comprising:

a digtally controlled oscillator means for genertng an output signal having a linear transfer function;

a read counter means operativley coupled to receive said output signal from said digitally controlled oscillator means, said read counter means being operatively configured to provide a sampling reference signal to said linear all-digital phase locked loop at a predetermined time;

an input synchronizer means operatively coupled to receive a gapped input clock signal and to synchronize said gapped input clock signal to a local high speed reference clock signal received by said input synchronizer means;

means for applying the gapped input clock signal to said input synchronizer means;

write counter means operatively coupled to receive the gapped input clock signal which is output from said input synchronizer means, said write counter means being configured to be incremented in count by the leading edge of each pulse of said received gapped input clock signal;

phase counter means operatively coupled to receive the gapped input clock signal which is output from said input synchronizer means, said phase counter means being configured to run at a predetermined higher frequency than said write counter means such that said phase counter means counts to a predetermined integer number for each normal count of said write counter means, said phase counter means being configured to being reset to zero by the leading edge of each pulse of saids gapped input clock signal;

sampling means operatively coupled to receive an output signal from said write counter means and an output signal from said phase counter means, said sampling means being configured to add said output signals together to provide a resulting signal upon receipt of said sampling reference signal output from said read counter means and to provide said resulting signal, in the form of a digital word with integer and fractional parts, as an input to said digitally controlled oscillator means.

2. A digital phase locked loop according to claim 1 further comprising a digital filter operatively connected between said sampling means and said digitally controlled oscillator means and being configured to perform a low pass filter function on said resulting signal which is output from said sampling means.

3. A digital phase locked loop sccording to claim 1 wherein said write counter means comprises a counter operatively coupled to a code conversion circuit.

4. A digital phase locked loop according to claim 3 wherein said conversion circuit is configured to convert the digital count received from said counter to a two's complement code to be input to said sampling means.

5. A digital phase locked loop according to claim 1 wherein said phase counter means comprise counter means operatively coupled to receive an input from divider means, said divider means operatively coupled to receive said local high speed reference clock signal and configured to divide said local high speed reference clock signal by a first predetermined number which provides an output signal to said counter means which allows said counter means to count to a number determined by the time between the receipt of the leading edge of consecutive pulses of said received gapped input clock signal.

6. A digital phase locked loop according to claim 1 wherein said sampling means comprises a pre-load register means operatively coupled to a data mask means, said pre-load register means being configured to provide an output signal to said data mask means, said output signal being formed from the addition of input signals to said pre-load register means from said write counter means and said phase counter means.

7. A digital phase locked loop according to claim 6 wherein said data mask means is configured to provide a predetermined signal out to said digitally controlled oscillator means when said digital phase locked loop is in an out-of-lock condition.

8. A digital phase locked loop according to claim 1 wherein said digitally controlled oscillator means comprises a digital comparator means and a $2^m$ counter means, where m is a positive integer greater than two, wherein the digital comparator means receives and compares the output signal from said sampling means with the output from said $2^m$ counter means, said digital comparator means provides an output signal when the value of the output signal from said $2^m$ counter means is equal to or exceeds the value of the output signal from said sampling means.

9. A digigtal phase locked loop according to claim 8 further including a divider means operatively coupled to receive an output signal from said digital comparator means and to provide an output signal to said $2^m$ counter means, where m is a positive integer greater than two, said divider means being operatively coupled to receive said local high speed reference clock as an input and configured to divide said local high speed reference clock by a predetermined number n, where n is a positive integer greater than four, when not receiving said output signal form said digital comparator means and configured to divide said local high speed reference clock by a predetermined number n−1 when receiving said output signal from said digial comparator means.

* * * * *